(12) United States Patent
Holsteyns et al.

(10) Patent No.: US 11,476,162 B2
(45) Date of Patent: Oct. 18, 2022

(54) METHOD FOR DICING A SEMICONDUCTOR SUBSTRATE INTO A PLURALITY OF DIES

(71) Applicant: IMEC VZW, Leuven (BE)

(72) Inventors: Frank Holsteyns, Kessel-Lo (BE); Eric Beyne, Heverlee (BE); Christophe Lorant, Gembloux (BE); Simon Braun, Hassloch (DE)

(73) Assignee: Imec VZW, Leuven (BE)

( * ) Notice: Subject to any disclaimer, the term of this patent is extended or adjusted under 35 U.S.C. 154(b) by 61 days.

(21) Appl. No.: 17/038,737

(22) Filed: Sep. 30, 2020

(65) Prior Publication Data
US 2021/0098299 A1    Apr. 1, 2021

(30) Foreign Application Priority Data

Sep. 30, 2019   (EP) .................................... 19200554

(51) Int. Cl.
*H01L 21/78* (2006.01)
*H01L 21/56* (2006.01)
(Continued)

(52) U.S. Cl.
CPC ............ *H01L 21/78* (2013.01); *H01L 21/566* (2013.01); *H01L 23/3192* (2013.01); *H01L 23/481* (2013.01)

(58) Field of Classification Search
None
See application file for complete search history.

(56) References Cited

U.S. PATENT DOCUMENTS

| 6,573,156 B1 | 6/2003 | Wang et al. |
| 7,482,251 B1 | 1/2009 | Paulsen et al. |

(Continued)

FOREIGN PATENT DOCUMENTS

| EP | 2913848 A1 | 9/2015 |
| EP | 3531447 A2 | 8/2019 |

OTHER PUBLICATIONS

Extended European Search Report and Written Opinion, EP Application No. 19200554.4, dated Apr. 2, 2020, 8 pages.

(Continued)

*Primary Examiner* — Jay C Chang
(74) *Attorney, Agent, or Firm* — McDonnell Boehnen Hulbert & Berghoff LLP

(57) ABSTRACT

A method is provided for dicing a semiconductor substrate into a plurality of dies, the semiconductor substrate having a front side including a plurality of device areas, a back side, and a plurality of through substrate vias. The method includes defining, from the front side, at least one trench to be formed between adjacent device areas, forming the at least one trench, from the front side of the semiconductor substrate, arranging a protective layer on the front side of the semiconductor substrate, thinning the semiconductor substrate from the back side to reduce the thickness of the semiconductor substrate, processing the back side of the semiconductor substrate to form at least one contact, the contact contacting at least one through substrate via, etching through the minor portion of the thickness of the semiconductor substrate underneath the at least one trench, and dicing the semiconductor substrate into the plurality of dies.

20 Claims, 7 Drawing Sheets

(51) Int. Cl.
 *H01L 23/31* (2006.01)
 *H01L 23/48* (2006.01)

(56) References Cited

U.S. PATENT DOCUMENTS

| | | | |
|---|---|---|---|
| 9,741,620 | B2* | 8/2017 | Uzoh .................... H01L 24/94 |
| 2004/0113283 | A1* | 6/2004 | Farnworth ............. H01L 24/11 |
| | | | 257/E29.022 |
| 2004/0121563 | A1 | 6/2004 | Farnworth et al. |
| 2005/0282360 | A1* | 12/2005 | Kida ..................... H01L 21/78 |
| | | | 257/E23.179 |
| 2006/0189099 | A1 | 8/2006 | Lu et al. |
| 2012/0313176 | A1* | 12/2012 | Frohberg ......... H01L 21/76816 |
| | | | 257/E27.06 |
| 2013/0037935 | A1 | 2/2013 | Xue et al. |
| 2014/0264770 | A1 | 9/2014 | Okandan et al. |
| 2015/0091183 | A1 | 4/2015 | Fischer et al. |
| 2016/0133476 | A1 | 5/2016 | Takahashi et al. |
| 2019/0057891 | A1* | 2/2019 | Marinov ............... H01L 21/78 |

OTHER PUBLICATIONS

Bosma, M. J., J. Visser, O. Evrard, P. De Moor, K. De Munck, D. Sabuncuoglu Tezcan, and E. N. Koffeman. "Edgeless silicon sensors for Medipix-based large-area X-ray imaging detectors." Journal of Instrumentation 6, No. 01 (2011): C01035.

\* cited by examiner

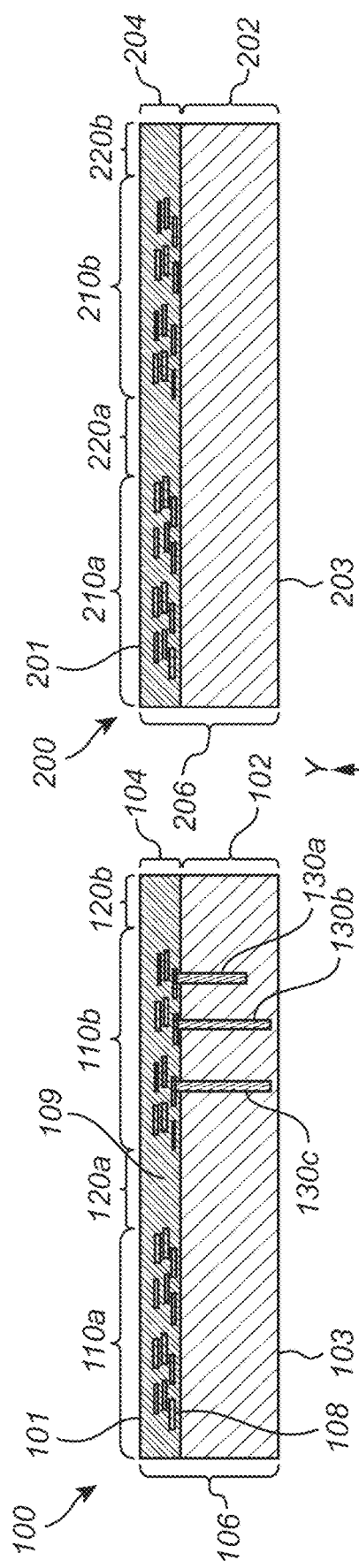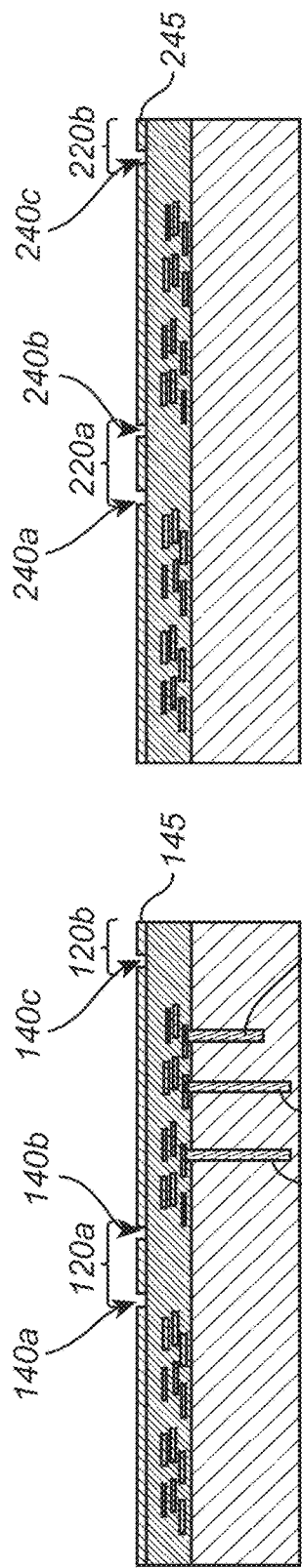

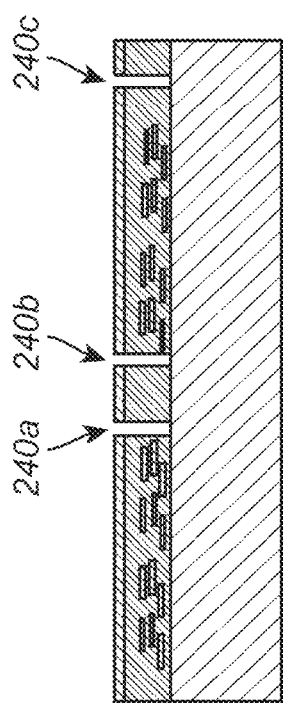
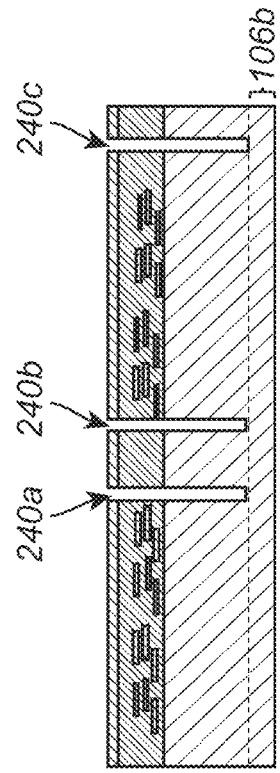
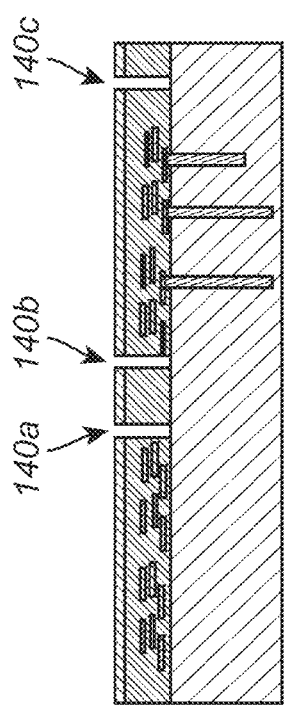
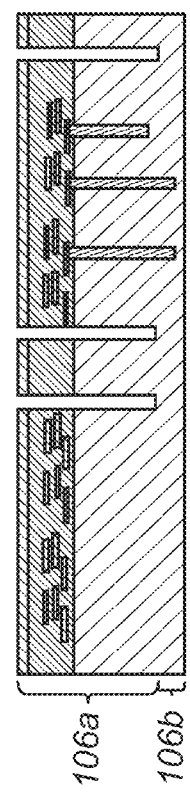

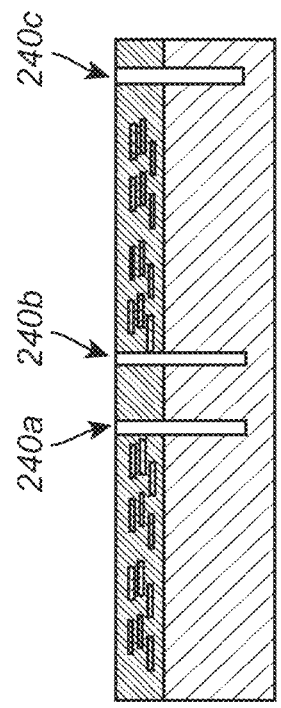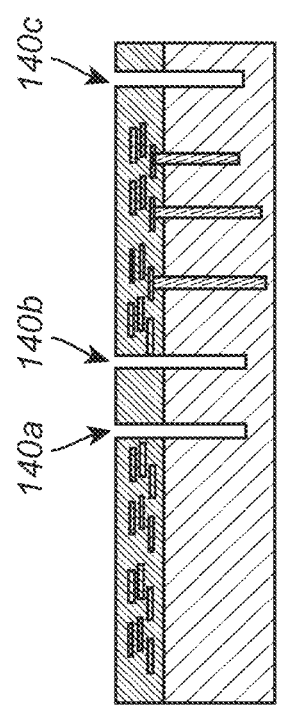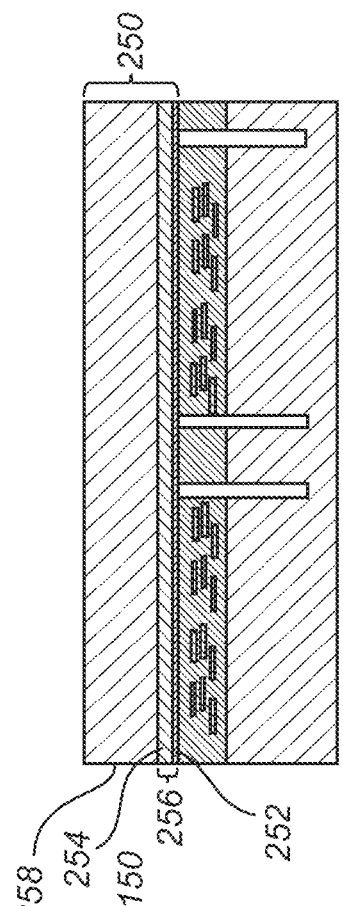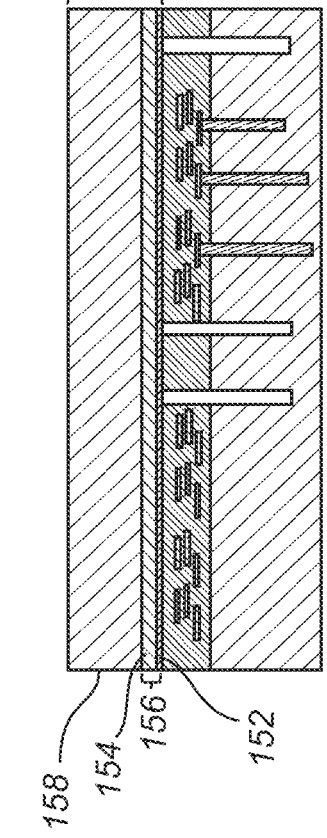

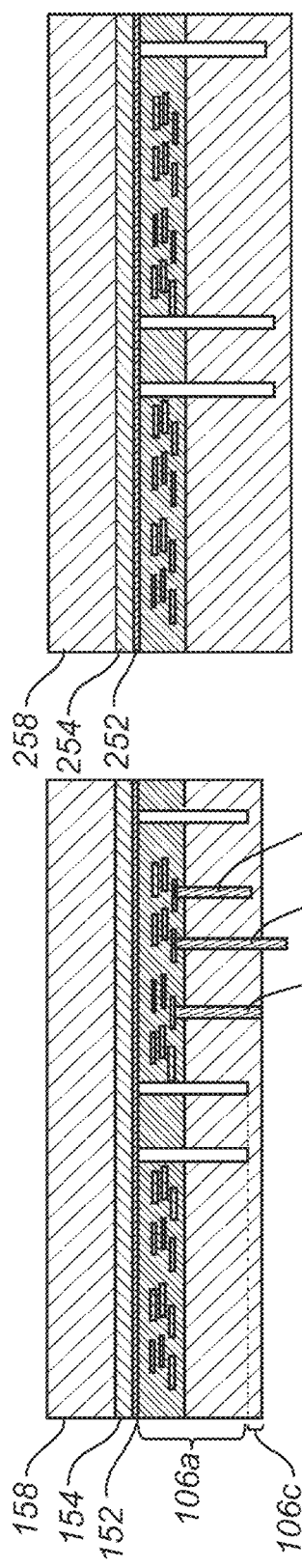
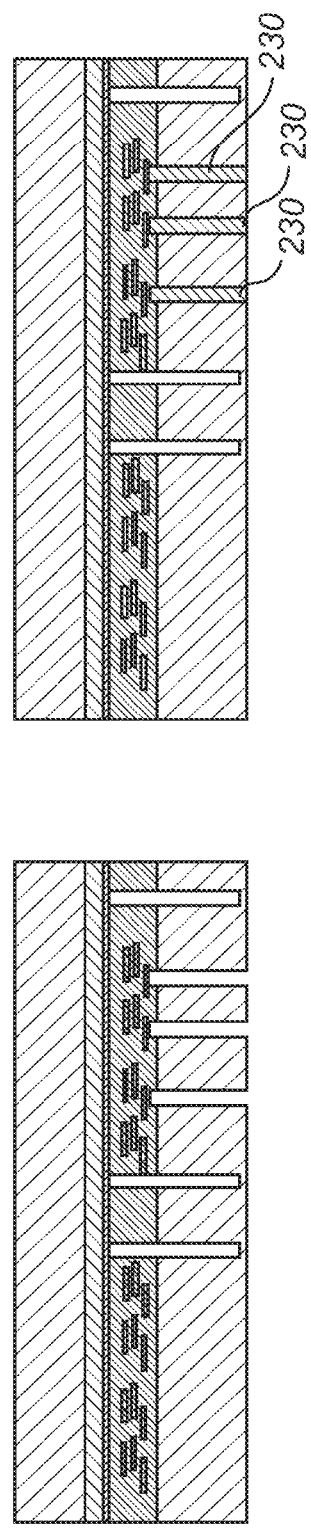
Fig. 7A
Fig. 7B
Fig. 7C
Fig. 7D

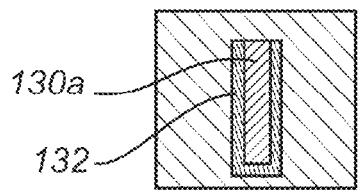 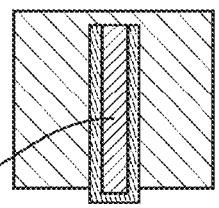 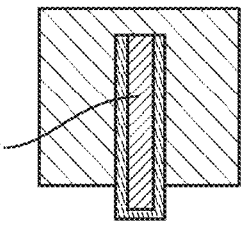
Fig. 13A　　Fig. 13B　　Fig. 13C
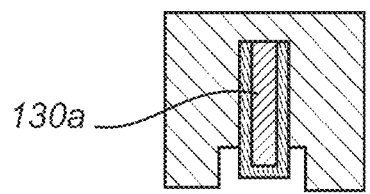 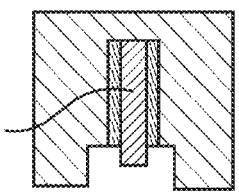
Fig. 14　　Fig. 15
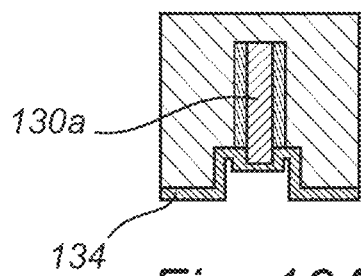 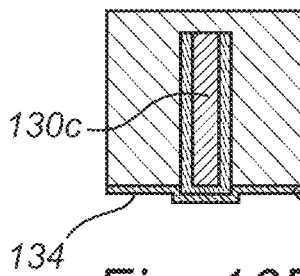 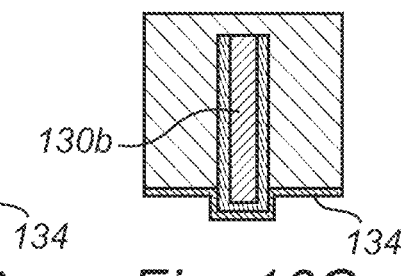
Fig. 16A　　Fig. 16B　　Fig. 16C
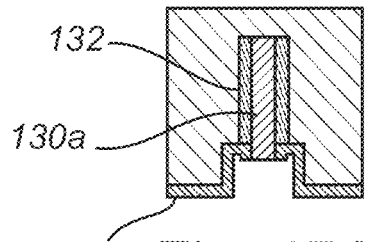 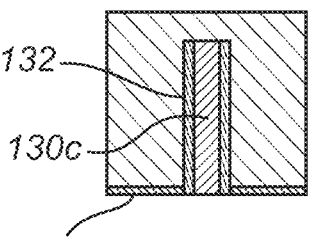 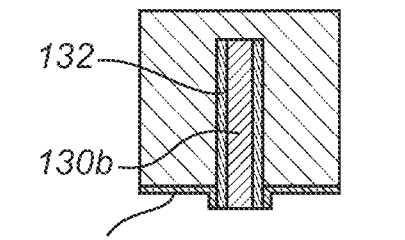
Fig. 17A　　Fig. 17B　　Fig. 17C
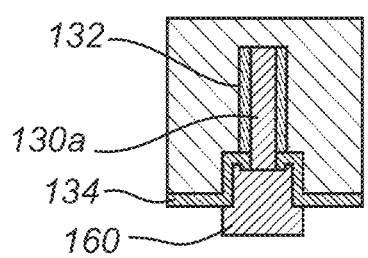 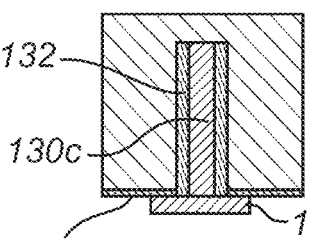 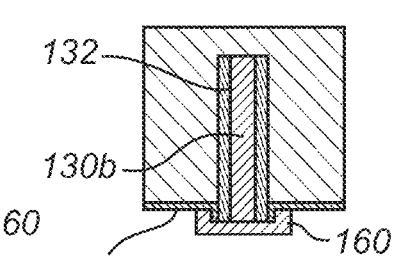
Fig. 18A　　Fig. 18B　　Fig. 18C

METHOD FOR DICING A SEMICONDUCTOR SUBSTRATE INTO A PLURALITY OF DIES

CROSS-REFERENCE TO RELATED APPLICATIONS

The present application is a non-provisional patent application claiming priority to EP Patent Application No. 19200554.4, filed Sep. 30, 2019, the contents of which are hereby incorporated by reference.

FIELD OF THE DISCLOSURE

The present disclosure relates to a method for dicing a semiconductor substrate into a plurality of dies.

BACKGROUND

A type of semiconductor product include semiconductor devices which are stacked and packed into one package. Such semiconductor devices may be produced on one substrate and may be diced into dies, prior to stacking. The dicing of the semiconductor substrate may produce particles, due to mechanical separation of different dies. The particles may have sizes in the order of, or even larger than, the sizes of the semiconductor devices. The particles may stick on surfaces of the semiconductor devices and may form voids around them. Thereby, yield and functionality of the semiconductor products, formed by the semiconductor devices contaminated by such particles, may be affected.

SUMMARY

The present disclosure relates to a method which protects surfaces of the semiconductor devices during the dicing.

According to an aspect of the present disclosure, there is provided a method for dicing a semiconductor substrate into a plurality of dies, wherein the semiconductor substrate having a front side provided with a plurality of device areas, a back side, and a plurality of through substrate vias, the method comprising: defining, from the front side of the semiconductor substrate, at least one trench to be formed between adjacent device areas, forming the at least one trench, from the front side of the semiconductor substrate, such that a major portion of a thickness of the semiconductor substrate is removed in the at least one trench, thereby leaving a minor portion of the thickness of the semiconductor substrate underneath the at least one trench, arranging a protective layer on the front side of the semiconductor substrate, the protective layer covering at least a plurality of device areas, thinning the semiconductor substrate from the back side to reduce the thickness of the semiconductor substrate, processing the back side of the semiconductor substrate to form at least one contact, the contact contacting at least one through substrate via, etching, from the back side of the semiconductor substrate, through the minor portion of the thickness of the semiconductor substrate underneath the at least one trench, thereby separating the semiconductor substrate into a plurality of device areas arranged underneath the protective layer, and dicing the semiconductor substrate into the plurality of dies.

The present disclosure describes embodiments that allow defining the at least one trench to be formed between adjacent device areas at desired areas with desired shapes such as square shape. The step of forming the at least one trench, from the front side of the semiconductor substrate, by removing a major portion of a thickness of the semiconductor substrate and leaving a minor portion of the thickness of the semiconductor substrate underneath the at least one trench allows forming the at least one trench while holding the adjacent device areas together. The step of arranging the protective layer on the front side of the semiconductor substrate allows protecting the front side of the semiconductor substrate during the following steps to be performed. The protective layer is arranged such that it covers at least a plurality of device areas. Thereby, the protective layer protects the front side of the semiconductor substrate during the following steps, particularly the dicing step, to be performed. In other words, the protective layer protects the front side of the semiconductor substrate against particles typically being formed during the dicing step and against other contaminations. The protective layer may cover the at least one trench. The protective layer may not cover the at least one trench. The step of thinning the semiconductor substrate from the back side allows reducing a thickness of the semiconductor substrate including a thickness of the minor portion of the semiconductor substrate underneath the at least one trench. The steps of thinning and etching, from the back side of the semiconductor substrate, allow mechanical separation of the adjacent device areas while the adjacent device areas are held together by the protective layer. The step of processing the back side of the semiconductor substrate to form at least one contact, the contact contacting at least one through substrate via, allows forming contacts enabling contacting the device areas to be stacked and packed. The step of dicing allows separation of the plurality of device areas of the semiconductor substrate, obtained subsequent to the step of etching, into the plurality of dies. For instance, the step of dicing may include separation of the plurality of device areas of the semiconductor substrate from at least a portion of the protective layer arranged underneath. Thereby the step of dicing allows dicing the plurality of device areas of the semiconductor substrate into a plurality of dies. The step of dicing further allows singulation of dies one by one and hence provides an improved control and reliability compared to singulation of multiple dies attached to each other.

By the "device areas" are hereby meant areas of the semiconductor substrate comprising devices. Examples of such devices may be transistors formed by semiconductor fabrication processing such as front-end-of-line (FEOL) and back-end-of-line (BEOL) processing.

By the "front side" is hereby meant an upper surface of the semiconductor substrate. By the "back side" is hereby meant a lower surface of the semiconductor substrate. In case of the semiconductor substrate includes a stack of layers, the front side and the back side are respectively the uppermost and the lowermost surfaces.

By the "through substrate vias" is hereby meant vias formed through the substrate such that the vias typically extend perpendicularly to the front side or the back side of the semiconductor substrate i.e. vias typically extending in a direction parallel to a normal direction of the front and the back side. An example of the through substrate vias is through silicon vias (TSV) which is the term commonly used when the substrate is made of silicon.

By "on" is hereby meant above and in contact with. For instance, by arranging the protective layer on the front side of the semiconductor substrate is hereby meant that the protective layer is arranged above and in contact with the front side of the semiconductor substrate.

By "underneath" is hereby meant below and in contact with. For instance, by leaving a minor portion of the thickness of the semiconductor substrate underneath the at least one trench is hereby meant leaving a minor portion of the thickness of the semiconductor substrate below and in contact with the at least one trench.

By "die" is hereby meant a portion of the semiconductor substrate (e.g., a device area separated from the semiconductor substrate). Separation of the die may, for example, be performed by separating the semiconductor substrate into the plurality of device areas, obtained subsequent to the step of etching, from the protective layer arranged underneath. The die may include a device area or a plurality of device areas. The die may have various shapes and sizes.

A width of the at least one trench may be in a range of 0.5 to 50 µm. This trench width range may facilitate dicing the semiconductor substrate into the plurality of dies and singulation of the dies one by one i.e. the trench width range may prevent unintentional attachment of dies to each other.

The minor portion of the thickness of the semiconductor substrate underneath the at least one trench may have a thickness in a range of 0.3 to 100 µm. This thickness range may provide a sufficient mechanical support to hold the semiconductor substrate together prior to the step of arranging the protective layer. This thickness range may also facilitate the step of thinning the semiconductor substrate from the back side.

The at least one trench may include two parallel trenches extending between the adjacent device areas. The parallel trenches may be advantageous when the semiconductor substrate includes additional structures arranged between the adjacent device areas such as test structures. In the case of having test structures, only one trench may not allow a complete removal of the test structures i.e. the test structures may remain (e.g., along edges of the dies), subsequent to the step of dicing. Thereby, the dies may include metals and other materials of the test structures along their edges. The presence of the metals and other materials of the test structures in the dies may in turn lead to contamination of the dies (e.g., due to corrosion of the test structures metals). Moreover, the parallel trenches may facilitate singulation of the semiconductor substrate into dies.

The step of arranging the protective layer may include depositing a bonding material on the front side of the semiconductor substrate and attaching a carrier wafer to the bonding material. The bonding material may allow bonding of the semiconductor substrate to the carrier wafer. The bonding material may allow separation of the front side of the semiconductor substrate from the carrier wafer in the step of dicing.

The bonding layer may include a layer or a stack of layers. For instance, the bonding layer may include a release layer and a protective layer arranged on the front side of the semiconductor substrate. The release layer may allow separation of the front side of the semiconductor substrate in the step of dicing. An example of a release layer may be a photosensitive layer.

The carrier wafer may provide a mechanical support for the semiconductor substrate during the steps of thinning, processing, etching and dicing. The carrier wafer may be cleaned and reused, subsequent to the step of the dicing.

The step of dicing the semiconductor substrate into the plurality of dies may include separating the bonding material of the protective layer from the front side of the semiconductor substrate. Thereby, no or little bonding material may remain on the front side of the semiconductor substrate, subsequent to the step of dicing.

In the case that the bonding material includes a release layer and a protective layer, separating the bonding material of the protective layer from the front side of the semiconductor substrate may be done by arranging the release layer on the front side of the semiconductor substrate and arranging the protective layer on the release layer. Thereby, no or little protective layer may remain on the front side of the semiconductor, subsequent to the step of dicing. In this case, the protective layer may act as a glue to adhere the release layer to the carrier wafer.

The step of dicing the semiconductor substrate into the plurality of dies may include separating the bonding material of the protective layer from the carrier wafer leaving the bonding material of the protective layer on the front side of the semiconductor substrate. Thereby, the front side of the semiconductor substrate may be protected by the bonding material, subsequent to the step of dicing.

In the case that the bonding material includes the release layer and the protective layer, leaving the bonding material of the protective layer on the front side of the semiconductor substrate may be done by arranging the protective layer on the front side of the semiconductor substrate and arranging the release layer on the protective layer. Thereby, the protective layer may remain on the front side of the semiconductor substrate, subsequent to the step of dicing.

The step of the defining the at least one trench to be formed between adjacent device areas may include forming a photoresist on the front side of the semiconductor substrate covering a plurality of device areas, and patterning the photoresist thereby defining the at least one trench between the adjacent device areas. The steps of forming and patterning the photoresist are compatible with semiconductor fabrication processing and may provide improved flexibility and reliability in defining the at least one trench. In addition, the photoresist may remain on the front side of the semiconductor substrate and may protect the front side of the semiconductor substrate during the subsequent method steps to be performed.

The step of the forming the at least one trench may include etching the at least one trench, from the front side of the semiconductor substrate, using the photoresist as an etch mask. Thereby the photoresist may be used not only for patterning the front side of the semiconductor substrate but also for masking the front side of the semiconductor substrate in the step of etching. This may in turn decrease a time and a number of method steps for dicing the semiconductor substrate at least by eliminating a step of defining a mask.

The step of thinning the semiconductor substrate may further include revealing at least one through substrate via. The least one through substrate via may be exposed in the step of thinning. The least one through substrate via may protrude from the back side of the semiconductor substrate in the step of thinning. Revealing at least one through substrate via may allow for no additional step being included prior to the step of the processing the back side of the semiconductor substrate to form the at least one contact.

The method may further include, prior to the step of processing the back side of the semiconductor substrate, forming, from the back side of the semiconductor substrate, an opening underneath at least one through substrate via to reveal the at least one through substrate via. In example embodiments, the plurality of the through substrate vias of the semiconductor substrate have different heights or penetration depths into the semiconductor substrate, and this step may facilitate revealing the at least one through substrate via prior to the step of the processing the back side of the semiconductor substrate to form the at least one contact.

The step of processing the back side of the semiconductor substrate to form the at least one contact may further include forming a passivation layer on the back side of the semiconductor substrate, patterning the passivation layer underneath the at least one through substrate via to form an opening exposing at least a portion of the at least one through substrate via, and forming a contact contacting the exposed portion of the at least one through substrate via. Thereby the formed contact may facilitate steps of contacting a stack of dies to be formed, subsequent to the step of dicing the semiconductor substrate into the plurality of dies.

The carrier wafer may be a light transparent wafer such as an ultraviolet (UV) light transparent wafer. A light transparent carrier wafer may be used with a photosensitive bonding material. This may in turn facilitate separating the bonding material from the front side of the semiconductor substrate. In the case that the bonding material includes the release layer and the protective layer and that the release layer is arranged on the front side of the semiconductor substrate and the protective layer is arranged on the release layer, this may in turn facilitate separating the release layer from the front side of the semiconductor substrate.

This may alternatively facilitate separating the bonding material from the carrier wafer. In the case that the bonding material includes the release layer and the protective layer and that the protective layer is arranged on the front side of the semiconductor substrate and the release layer is arranged on the protective layer, this may in turn facilitate separating the release layer from the protective layer.

The semiconductor substrate may include Si. The semiconductor substrate may be suitable for semiconductor fabrication processing.

BRIEF DESCRIPTION OF THE FIGURES

The above, as well as additional, features will be better understood through the following illustrative and non-limiting detailed description of example embodiments, with reference to the appended drawings.

FIGS. 1A-18C schematically illustrate various steps of a method for dicing a semiconductor substrate into a plurality of dies, according to example embodiments.

FIGS. 1A-7D schematically illustrate two variations: a first variation of example embodiments (shown in FIGS. 1A-7A) schematically illustrates initial steps of dicing a semiconductor substrate wherein the semiconductor substrate includes a plurality of through substrate vias, and a second variation of example embodiments (shown in FIGS. 1B-7B) schematically illustrates initial steps of dicing a semiconductor substrate wherein the semiconductor substrate does not include through substrate vias.

FIGS. 7C and 7D schematically illustrate steps of forming substrate through vias in the second variation, according to example embodiments.

FIGS. 8-18C schematically illustrates other steps of dicing a semiconductor substrate which are common for both variations, according to example embodiments.

Figure 9:
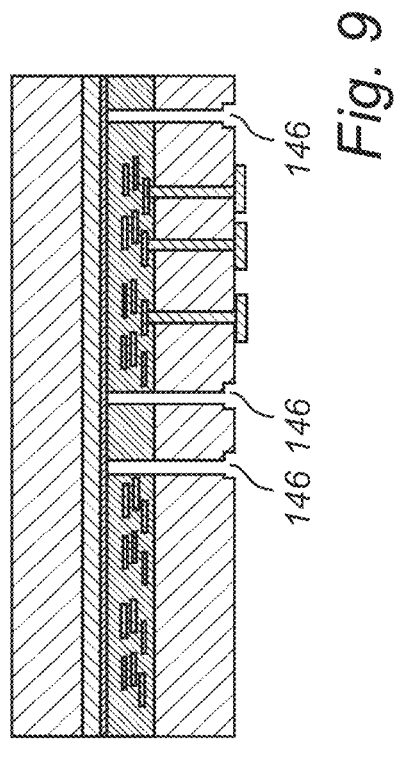

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Various methods for dicing a semiconductor substrate into a plurality of dies will now be disclosed in connection with FIGS. 1-18.

FIG. 1a shows a cross-sectional view of semiconductor substrate 100 of the method. The semiconductor substrate 100 has a front side 101 and a back side 103. In FIG. 1, the axis Y denotes a vertical direction corresponding to a normal direction with respect to the front side 101 of the semiconductor substrate 100. The axis X denotes a first horizontal direction along the front side 101 and the back side 103 of the semiconductor substrate 100 and the axis Z denotes a second horizontal direction along the front side 101 and the back side 103 of the semiconductor substrate 100, perpendicular to the first direction X. It should be noted that in the drawings the relative dimensions of the shown elements, such as the height, width or thickness of elements, is merely schematic and may, for the purpose of illustrational clarity, differ from a physical structure.

FIG. 1a shows that the semiconductor substrate 100 includes a lower portion 102 and upper portion 104 along the Y direction. The lower portion 102 of the semiconductor substrate 100 may be any substrate suitable for semiconductor processing. The lower portion 102 may for instance be a semiconductor substrate. The lower portion 102 may include silicon (Si). The lower portion 102 may include germanium (Ge). The lower portion 102 may be a Si substrate, a Ge substrate, a SiGe substrate. Other examples include a silicon-on-insulator (SOI) substrate, a GeOI substrate or a SiGeOI substrate.

FIG. 1a shows that the front side 101 of the semiconductor substrate is provided with a plurality of device areas 110. In FIG. 1a and the following figures, two device areas 110a and 110b are shown. However, it should be noted that the front side 101 of semiconductor substrate 100 may be provided with any number of device areas 110 (e.g., outside the illustrated region). The plurality of the device areas 110a and 110b, shown in FIG. 1a, are formed in the upper portion 104 of the semiconductor substrate 100. The plurality of the device areas 110a and 110b may be formed in the lower 102 and upper portion 104 of the semiconductor substrate 100.

FIG. 1a shows an example wherein the device areas 110a and 110b are transistors fabricated by the semiconductor fabrication processing. FIG. 1a shows the device areas 110a and 110b after the FEOL and BEOL processing wherein metal interconnects 108 are formed and the device areas 110a and 110b are embedded in a dielectric layer 109. Other examples of device areas are memory elements such as random access memory (RAM) and NAND memory, microelectromechanical systems (MEMS), optical devices and radio frequency devices. The device areas 110, metal interconnects 108 and the dielectric layer 109 may be formed using semiconductor device fabrication processing. As an example, the metal interconnects 108 may be formed of copper (Cu) and the dielectric layer 104 may be formed of $SiO_x$ or any low-k dielectric material.

The semiconductor substrate 100 further includes a plurality of through substrate vias 130. In FIG. 1a and the following figures, three through substrate vias 130a, 130b, and 130c are shown under the device area 110b. However, it should be noted that the semiconductor substrate 110 may be provided with any number of through substrate vias under any device area, e.g. inside and/or outside the illustrated region. The through substrate vias 130 extend through semiconductor substrate 100 i.e. along the Y direction. The through substrate vias 130 may have sizes in a range of 0.1 to 20 µm along the X and Z directions. The through substrate vias 130 may have a height in a range of 0.3 to 300 µm along the Y direction. In other words, the through substrate vias 130 may penetrate the semiconductor substrate 100 to a depth in a range of 0.3 to 300 µm along the Y direction. FIG. 1a shows that the through substrate vias 130 extend through the upper 104 and the lower 102 portions of the semiconductor substrate 100. FIG. 1a also shows that the three through substrate vias 130a, 130b, and 130c have different heights in the lower portion 102 of the semiconductor substrate 100. Examples of the through substrate vias 130 are the through Si vias (TSV) used in semiconductor device fabrication processing. The through substrate vias 130 may be formed of e.g. copper (Cu).

FIG. 1a further shows that the plurality of device areas 110, provided on the front side 101 of the semiconductor substrate, are separated by trench areas or separation areas 120. FIG. 1a shows two of such trench areas 120a and 120b. The trench area 120b is arranged adjacent to the device area 110b and another device area (outside the illustrated region). The trench area 120a is arranged between the adjacent device areas 110a and 110b. The trench area 120a is arranged on the opposite side of the device area 110b along the X direction. A width of the trench areas 120 along the X direction may be in a range of 0.5 to 50 µm. The trench areas 120a and 120b shown in FIG. 1a extend along the Z direction. However, the semiconductor substrate 100 may include trench areas 120 extending along other directions. For instance, the semiconductor substrate 100 may include trench areas 120 extending along the X direction.

Now referring to FIG. 2a, the method includes defining, from the front side 101 of the semiconductor substrate 100, at least one trench 140 to be formed between the adjacent device areas 110. The step of defining the at least one trench 140 may be performed by laser scribing, blade cutting or plasma etching. The step of the defining the at least one trench 140 to be formed between adjacent device areas 110 may include forming a photoresist 145 on the front side 101 of the semiconductor substrate 110. The photoresist 145 may be formed by spin coating or another way of forming photoresist. The photoresist 145 may be formed of a positive or a negative photoresist. The photoresist 145 may only cover the plurality of device areas 110. The photoresist 145 may cover both the plurality of device areas 110 and the trench areas 120, as shown in FIG. 2a.

The method may proceed by patterning the photoresist 145 thereby defining the at least one trench 140 between the adjacent device areas 110. The step of patterning the photoresist 145 may be performed by using an electron beam lithography or UV lithography. The photoresist 145 may be removed, subsequent to the step of patterning the photoresist 145 and defining the at least one trench 140 between the adjacent device areas 110. The photoresist 145 may not be removed, subsequent to the step of patterning the photoresist 145 and defining the at least one trench 140 between the adjacent device areas 110.

The at least one trench 140 may include two parallel trenches 140 extending between the adjacent device areas 110. FIG. 2a shows that one trench 140c is defined in the trench area 120b and two trenches 140a and 140b are defined in the trench area 120a. The two parallel trenches 140a and 140b are defined between the adjacent device areas 110a and 110b. The trench 140c and the parallel trenches 140a and 140b shown in FIG. 2a extend along the Z direction. The parallel trenches 140 may be defined e.g. when the trench areas 120 includes additional structures such as metal lines or test structures. The parallel trenches 140 may define scribe lines. A width of the at least one trench 140 may be in a range of 1 to 100 µm.

The method proceeds by forming the at least one trench 140, from the front side 101 of the semiconductor substrate 100. The step of the forming the at least one trench 140 may include etching the at least one trench 140, from the front side 101 of the semiconductor substrate 100, using the photoresist 145 as an etch mask. The step of forming the at least one trench 140, from the front side 101 of the semiconductor substrate 100 may be performed in a single step or in different steps. FIGS. 3a and 4a show that the step of forming the at least one trench 140, from the front side 101 of the semiconductor substrate 100 is performed in two steps, using the photoresist 145 as an etch mask. FIG. 3a shows the trenches 140a, 140b and 140c, subsequent to an etching step through the upper portion 104 of semiconductor substrate 100, using the photoresist 145 as an etch mask. FIG. 4a shows the trenches 140a, 140b and 140c, subsequent to an etching step through the lower portion 102 of semiconductor substrate 100, using the photoresist 145 as an etch mask. The step of forming the at least one trench by etching may be performed by wet etching or dry etching. An example of techniques used for the dry etching is Bosch process. In the case of wet etching, examples of the etchant used are oxidizer plus fluoride (HF/HNO$_3$) or alkaline solutions such as TMAH, NH$_4$OH or Met(OH)$_x$.

In addition, FIG. 4a shows that the trenches 140a, 140b, and 140c are formed such that a major portion 106a of a thickness 106 of the semiconductor substrate 100 is removed. In other words, FIG. 4a shows that a minor portion 106b of the thickness 106 of the semiconductor substrate 100 is left underneath the trenches 140a, 140b, and 140c. The minor portion of the thickness of the semiconductor substrate underneath the at least one trench may have a thickness in a range of 10 to 100 µm. The photoresist 145, if present, may be removed subsequent to the step of forming the at least one trench 140. The photoresist 145, if present, may not be removed subsequent to the step of forming the at least one trench 140. FIG. 5a shows the semiconductor substrate 100 wherein the photoresist 145 is removed subsequent to the step of forming the at least one trench 140.

The method proceeds by arranging a protective layer 150 on the front side 101 of the semiconductor substrate 100. The protective layer 150 covers at least a plurality of device areas 110. The protective layer 150 may cover a plurality of device areas 110 and a plurality of trench areas 120. FIG. 6a shows that the protective layer 150 covers the device areas 110a and 110b and the trench areas 120a and 120b.

The step of arranging the protective layer 150 may include depositing a bonding material 156 on the front side 101 of the semiconductor substrate 100. The step of arranging the protective layer 150 may further include attaching a carrier wafer 158 to the bonding material 156.

The bonding material 156 may include a release layer 152 and a protective layer 154. FIG. 6a shows that the release layer 152 is deposited on the front side 101 of the semiconductor substrate 100. FIG. 6a further shows that the protective layer 154 is deposited on the release layer 152. Alternatively, the protective layer 154 may be deposited on the front side 101 of the semiconductor substrate 100 and the release layer 152 may be deposited on the protective layer 154. The bonding material 156, the release layer 152, and the protective layer 154 may be deposited by spin coating or vapor deposition. A thickness of the bonding material 156 along the Y direction may be in a range of 5 to 100 µm. A thickness of the release layer 152 along the Y direction may be in a range of 0.05 to 10 µm. A thickness of the protective layer 154 along the Y direction may be in a range of 1 to 99 µm. An example of the bonding material 156 is BrewerBond 220. An example of the release layer 152 is BrewerBond 701. An example of the protective layer 154 is AZ10XT. The carrier wafer 158 may be a light transparent wafer such as glass or sapphire.

The method proceeds by thinning the semiconductor substrate 100 from the back side 103 to reduce the thickness 106 of the semiconductor substrate 100. FIG. 7a shows that a portion 106c of the minor 106b portion of the thickness 106 of the semiconductor substrate 100 is remained underneath the at least one trench 140, subsequent to the step of thinning. The step of thinning the semiconductor substrate 100 from the back side 103 may be performed by any of or any combination of wet etching, dry etching, chemical mechanical polishing (CMP) or grinding. The step of thinning may be performed differently depending on e.g. a thickness of the substrate and a desired final result. For instance, in the step of thinning, up to several hundred micrometers of the thickness of the semiconductor substrate may be removed.

The step of thinning the semiconductor substrate 100 may further include revealing at least one through substrate via 130. FIG. 7a shows that the through substrate via 130b and 130c are revealed. FIG. 7a shows that the through substrate via 130c is exposed in the step of thinning. FIG. 13b shows a close-up view of the through substrate via 130c, exposed in the step of thinning. FIG. 13b further shows that the through substrate via 130c is covered by layer 132. For instance, the layer 132 may be formed of $SiO_x$, $Si_3N_4$, SiCO, SiCN, $Al_2O_3$ or similar materials.

FIG. 7a shows that the through substrate via 130b protrudes from the back side 103 of the semiconductor substrate 100 in the step of thinning. FIG. 13c shows a close-up view of the through substrate via 130b, protruding from the back side 103 of the semiconductor substrate 100. The through substrate vias 130 may protrude from the back side 103 of the semiconductor substrate 100 when the step of thinning is performed by a selective etching approach such as wet etching. However, in case that the step of thinning is performed by CMP or grinding, the through substrate vias 130 may become planarized i.e. may not protrude from the back side 103 of the semiconductor substrate 100.

The step of thinning the semiconductor substrate 100 may further include not revealing the at least one through substrate via 130. FIG. 7a shows that the through substrate via 130a is not revealed. FIG. 13a shows a close-up view of the through substrate via 130a, not revealed in the step of thinning. Such un-revealed through substrate vias 130 such as the through substrate via 130a shown in FIG. 7a may be revealed. This may be performed by forming, from the back side 103 of the semiconductor substrate 100, an opening underneath at least one through substrate via 130 to reveal the at least one through substrate via 130. FIG. 14 shows an opening formed, from the back side 103 of the semiconductor substrate 100, underneath the through substrate via 130a. FIG. 15 shows that the layer 132 is removed, from the back side 103 of the semiconductor substrate 100, to expose the through substrate via 130a.

Figure 8:
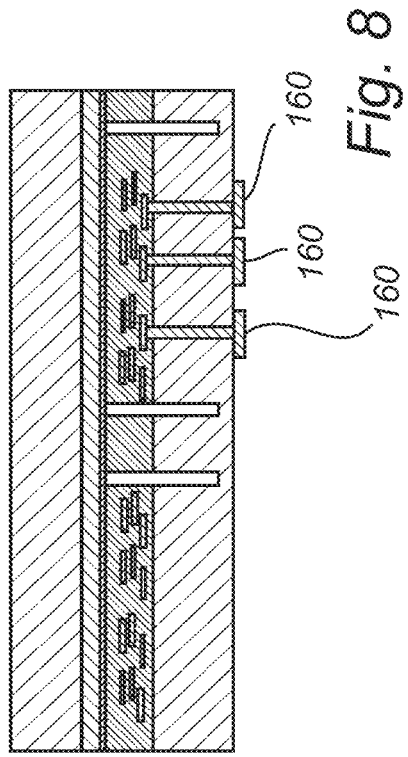

Now referring to FIG. 8, the method proceeds by processing the back side 103 of the semiconductor substrate 100 to form at least one contact 160, the contact 160 contacting at least one through substrate via 130. The processing of the back side 103 of the semiconductor substrate 100 to form the at least one contact 160 may include forming a passivation layer 134 on the back side 103 of the semiconductor substrate 100. The step of forming the passivation layer 134 may be performed on all the through substrate vias 130. FIGS. 16a, 16b, and 16c respectively show that a passivation layer 134 is formed on the back side 103 of the semiconductor substrate 100 on the revealed through substrate via 130a (revealed through the opening formation), the exposed through substrate via 130c, and the protruded through substrate via 130b. The step of forming the passivation layer 134 may be performed by deposition or another way of forming a passivation layer. The passivation layer 134 may be formed of e.g. $SiO_x$. A thickness of the passivation layer 134 may be in a range of 5 to 100 nm.

The processing of the back side 103 of the semiconductor substrate 100 to form the at least one contact 160 may proceed by patterning the passivation layer 134 underneath the at least one through substrate via 130 to form an opening. The opening may expose at least a portion of the at least one through substrate via 130. FIGS. 17a, 17b, and 17c respectively show that the opening is formed exposing at least a portion of the at least one through substrate via 130a, 130c, and 130b. The step of patterning the passivation layer 134 to form an opening for the through substrate vias 130b and 130c may be performed by CMP. For instance, the step of patterning the passivation layer 134 to form an opening for the through substrate via 130a (revealed through the opening formation) may be performed by depositing a photoresist layer on the back side 103 of the semiconductor substrate 100 and lithographically patterning the photoresist layer.

The processing of the back side 103 of the semiconductor substrate 100 to form the at least one contact 160 may further proceed by forming a contact 160 contacting the exposed portion of the at least one through substrate via 130. FIG. 8 shows the semiconductor substrate 100, subsequent to the step of forming the at least one contact 160. FIGS. 18a, 18b and 18c show close-up views of the contacts 160 contacting the respective through substrate vias 130a, 130c, and 130b. The step of forming the contact 160 may be performed by electroplating, atomic layer deposition (ALD), chemical vapor deposition (CVD) or physical vapor deposition (PVD). The contact 160 may be formed of any one of or any combination of Cu, Ni, Co, Sn, and Pb. A thickness of the contact 160 may be in a range of 1 to 100 µm.

Figure 10:
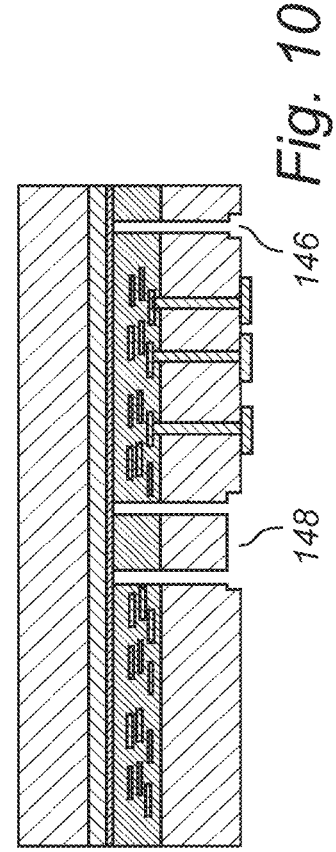

The method proceeds by etching, from the back side 103 of the semiconductor substrate 100, through the minor portion 106b of the thickness 106 of the semiconductor substrate 100 underneath the at least one trench 140. Thereby the step of etching separates the semiconductor substrate 100 into a plurality of device areas 110 arranged underneath the protective layer 150. FIGS. 9 and 10 show two examples of etching, from the back side 103 of the semiconductor substrate 100, through the minor portion 106b of the thickness 106 of the semiconductor substrate 100 underneath the at least one trench 140. In FIG. 9, a separate opening 146 is formed from the back side 103 of the semiconductor substrate 100 underneath each of the parallel trenches 140a and 140b. In FIG. 10, a common opening 148 is formed from the back side 103 of the semiconductor substrate 100 underneath the parallel trenches 140a and 140b.

Figure 11:
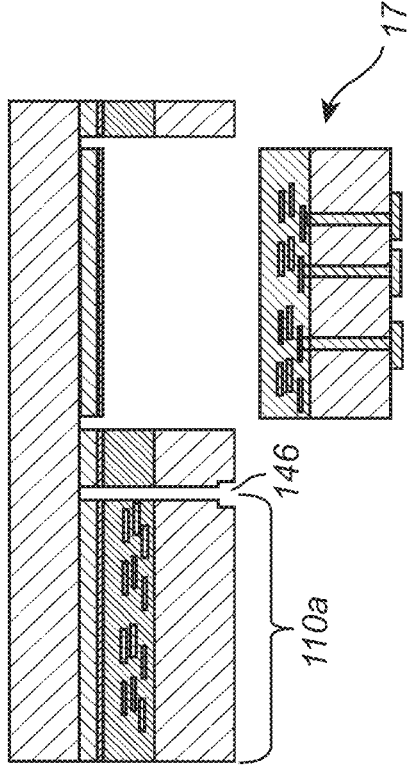

The method may proceed by dicing the previously separated semiconductor substrate 100 into the plurality of dies 170. The step of dicing the semiconductor substrate 100 into the plurality of dies 170 may include separating the bonding material 156 of the protective layer 150 from the front side 101 of the semiconductor substrate 100. In the case that the bonding material 156 includes the release layer 152 and the protective layer 154, the step of dicing the semiconductor substrate 100 into the plurality of dies 170 may include separating the release layer 152 and the protective layer 154 from the front side 101 of the semiconductor substrate 100. Separating of the release layer 152 and the protective layer 154 from the front side 101 of the semiconductor substrate 100 may be done by wet or dry etching. This is schematically shown in FIG. 11 that a die 170a has been formed by separating the release layer 152 and the protective layer 154 from the front side 101 of the semiconductor substrate 100.

Figure 12:
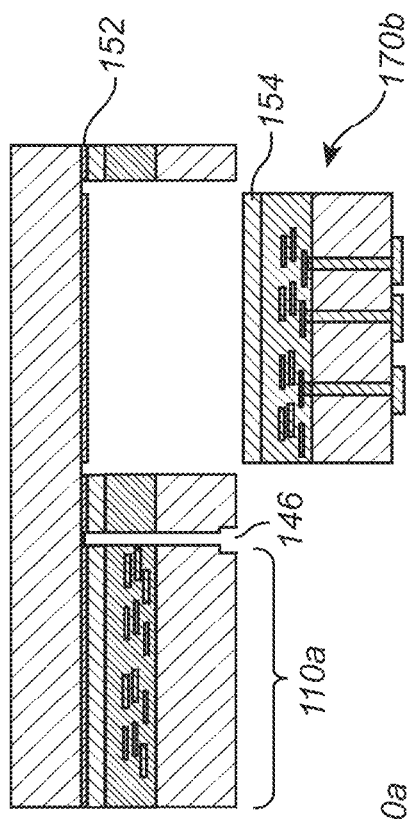

The step of dicing the semiconductor substrate 100 into the plurality of dies 170 may alternatively include separating the bonding material 156 of the protective layer 150 from the carrier wafer 158. The bonding material 156 of the protective layer 150 may remain on the front side 101 of the semiconductor substrate 100. An example of this is shown in FIG. 12. FIG. 12 shows that the bonding material 156 includes the release layer 152 and the protective layer 154, the protective layer 154 is formed on the front side 101 of the semiconductor and the release layer 152 is formed on the protective layer 154. As shown in FIG. 12, a die 170b has been formed by separating the protective layer 154 from the release layer 152 and the carrier wafer 158. In other words, FIG. 12 shows that the protective layer 154 has remained on the front side of the die 170b i.e. the front side of the die 170b is protected by the protective layer 154.

In examples in which the carrier wafer is a UV light transparent wafer and the bonding material 156 is photosensitive material, the step of separating bonding material 156 of the protective layer 150 may be performed by shining a laser light on the carrier wafer 158 such that the laser light becomes focused on the photosensitive bonding material 156. The step of separating the bonding material 156 of the protective layer 150 may also be performed by means of peal bonding. The carrier wafer 158 may be cleaned subsequent to the step of dicing. The carrier wafer 158 may be reused.

The semiconductor substrate 100 may be diced into a plurality of the dies 170. Each formed die 170 may be picked up by e.g. a die handling robot. The formed dies 170 may be cleaned, subsequent to the step of dicing. The formed dies 170 may be stacked on each other, subsequent to the step of dicing. The formed dies 170 may be populated onto another semiconductor substrate, subsequent to the step of dicing.

The method described above may be applied to a semiconductor substrate 200 having a front side 201, a back side 203, and a plurality of device areas 210 on the front side 201 i.e. not having a plurality of through substrate vias. FIGS. 1b-7b show initial steps of dicing the semiconductor substrate 200, similar to the FIGS. 1a-7a discussed above in relation to the semiconductor substrate 100. FIGS. 7c and 7d schematically illustrate steps of forming a plurality of substrate through vias 230 from the back side 203 of the semiconductor substrate 200. Further steps of dicing the semiconductor substrate 200 into a plurality of dies 270 may be performed in accordance with the steps discussed in relation to FIGS. 8-18.

The description provided above has been described with reference to a limited number of examples. However, as is readily appreciated by a person skilled in the art, other examples than the ones disclosed above are equally possible within the scope of the disclosure, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for dicing a semiconductor substrate into a plurality of dies, wherein the semiconductor substrate comprises a front side provided with a plurality of device areas, a back side, and a plurality of through substrate vias, the method comprising:
    defining, from the front side of the semiconductor substrate, at least one trench to be formed between adjacent device areas;
    forming the at least one trench, from the front side of the semiconductor substrate, such that a major portion of a thickness of the semiconductor substrate is removed in the at least one trench, thereby leaving a minor portion of the thickness of the semiconductor substrate underneath the at least one trench;
    arranging a protective layer on the front side of the semiconductor substrate, the protective layer covering at least a plurality of device areas;
    thinning the semiconductor substrate from the back side to reduce the thickness of the semiconductor substrate such that at least a portion of the minor portion of the thickness of the semiconductor substrate remains underneath the at least one trench;
    processing the back side of the semiconductor substrate to form at least one contact, the contact contacting at least one through substrate via;
    etching, from the back side of the semiconductor substrate, through the minor portion of the thickness of the semiconductor substrate underneath the at least one trench, thereby separating the semiconductor substrate into a plurality of device areas arranged underneath the protective layer; and
    dicing the semiconductor substrate into the plurality of dies.

2. The method according to claim 1, wherein a width of the at least one trench is in a range of 0.5 to 50 μm.

3. The method according to claim 1, wherein the minor portion of the thickness of the semiconductor substrate underneath the at least one trench has a thickness in a range of 0.3 to 100 μm.

4. The method according to claim 1, wherein the at least one trench comprises two parallel trenches extending between the adjacent device areas.

5. The method according to claim 1, wherein arranging the protective layer comprises:
    depositing a bonding material on the front side of the semiconductor substrate; and
    attaching a carrier wafer to the bonding material.

6. The method according to claim 5, wherein dicing the semiconductor substrate into the plurality of dies comprises separating the bonding material of the protective layer from the front side of the semiconductor substrate.

7. The method according to claim 5, wherein dicing the semiconductor substrate into the plurality of dies comprises separating the bonding material of the protective layer from the carrier wafer leaving the bonding material of the protective layer on the front side of the semiconductor substrate.

8. The method according to claim 5, wherein the carrier wafer is a light transparent wafer.

9. The method according to claim 1, wherein defining the at least one trench to be formed between adjacent device areas comprises:
- forming a photoresist on the front side of the semiconductor substrate covering a plurality of device areas; and
- patterning the photoresist thereby defining the at least one trench between the adjacent device areas.

10. The method according to claim 9, wherein forming the at least one trench comprises etching the at least one trench, from the front side of the semiconductor substrate, using the photoresist as an etch mask.

11. The method according to claim 1, wherein thinning the semiconductor substrate further comprises revealing at least one through substrate via.

12. The method according to claim 1, wherein the method further comprises:
- prior to the step of processing the back side of the semiconductor substrate, forming, from the back side of the semiconductor substrate, an opening underneath at least one through substrate via to reveal the at least one through substrate via.

13. The method according to claim 1, wherein processing the back side of the semiconductor substrate to form the at least one contact further comprises:
- forming a passivation layer on the back side of the semiconductor substrate;
- patterning the passivation layer underneath the at least one through substrate via to form an opening exposing at least a portion of the at least one through substrate via; and
- forming a contact contacting the exposed portion of the at least one through substrate via.

14. The method according to claim 1, wherein the semiconductor substrate comprises Si.

15. A semiconductor substrate prepared by a method for dicing the semiconductor substrate into a plurality of dies, wherein the semiconductor substrate comprises a front side provided with a plurality of device areas, a back side, and a plurality of through substrate vias, the method comprising the steps of:
- defining, from the front side of the semiconductor substrate, at least one trench to be formed between adjacent device areas on the front side of the semiconductor substrate;
- forming the at least one trench, from the front side of the semiconductor substrate, such that a major portion of a thickness of the semiconductor substrate is removed in the at least one trench, thereby leaving a minor portion of the thickness of the semiconductor substrate underneath the at least one trench;
- arranging a protective layer on the front side of the semiconductor substrate, the protective layer covering at least a plurality of device areas;
- thinning the semiconductor substrate from the back side of the semiconductor substrate to reduce the thickness of the semiconductor substrate such that at least a portion of the minor portion of the thickness of the semiconductor substrate remains underneath the at least one trench;
- processing the back side of the semiconductor substrate to form at least one contact, the contact contacting at least one through substrate via;
- etching, from the back side of the semiconductor substrate, through the minor portion of the thickness of the semiconductor substrate underneath the at least one trench, thereby separating the semiconductor substrate into a plurality of device areas arranged underneath the protective layer; and
- dicing the semiconductor substrate into the plurality of dies.

16. The semiconductor substrate according to claim 15, wherein a width of the at least one trench is in a range of 0.5 to 50 µm.

17. The semiconductor substrate according to claim 15, wherein the minor portion of the thickness of the semiconductor substrate underneath the at least one trench has a thickness in a range of 0.3 to 100 µm.

18. The semiconductor substrate according to claim 15, wherein the at least one trench comprises two parallel trenches extending between the adjacent device areas.

19. The semiconductor substrate according to claim 15, wherein thinning the semiconductor substrate further comprises revealing at least one through substrate via.

20. A semiconductor die prepared by a method for dicing a semiconductor substrate into a plurality of dies, wherein the semiconductor substrate comprises a front side provided with a plurality of device areas, a back side, and a plurality of through substrate vias, the method comprising the steps of:
- defining, from the front side of the semiconductor substrate, at least one trench to be formed between adjacent device areas on the front side of the semiconductor substrate;
- forming the at least one trench, from the front side of the semiconductor substrate, such that a major portion of a thickness of the semiconductor substrate is removed in the at least one trench, thereby leaving a minor portion of the thickness of the semiconductor substrate underneath the at least one trench;
- arranging a protective layer on the front side of the semiconductor substrate, the protective layer covering at least a plurality of device areas;
- thinning the semiconductor substrate from a back side of the semiconductor substrate to reduce the thickness of the semiconductor substrate such that at least a portion of the minor portion of the thickness of the semiconductor substrate remains underneath the at least one trench;
- processing the back side of the semiconductor substrate to form at least one contact, the contact contacting at least one through substrate via;
- etching, from the back side of the semiconductor substrate, through the minor portion of the thickness of the semiconductor substrate underneath the at least one trench, thereby separating the semiconductor substrate into a plurality of device areas arranged underneath the protective layer; and
- dicing the semiconductor substrate into the plurality of dies, wherein the semiconductor die is one of the plurality of dies.

* * * * *